(12) United States Patent
Yamazaki et al.

(10) Patent No.: US 9,591,285 B2
(45) Date of Patent: Mar. 7, 2017

(54) IMAGE SENSOR AND IMAGING DEVICE

(71) Applicant: OLYMPUS CORPORATION, Tokyo (JP)

(72) Inventors: Takeshi Yamazaki, Tokyo (JP); Kanto Miyazaki, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/717,478

(22) Filed: May 20, 2015

(65) Prior Publication Data
US 2015/0256812 A1    Sep. 10, 2015

Related U.S. Application Data

(63) Continuation of application No. PCT/JP2013/006820, filed on Nov. 20, 2013.

(51) Int. Cl.
*H04N 5/262* (2006.01)
*H04N 13/02* (2006.01)
(Continued)

(52) U.S. Cl.
CPC ... *H04N 13/0225* (2013.01); *H01L 27/14629* (2013.01); *H04N 13/0217* (2013.01); *H04N 5/3696* (2013.01)

(58) Field of Classification Search
CPC .... H04N 5/2624; H04N 5/2621; H04N 5/262; G06T 7/0024; G06T 7/00;
(Continued)

(56) References Cited

U.S. PATENT DOCUMENTS 6,396,873 B1    5/2002 Goldstein et al.
2009/0219432 A1    9/2009 Palum et al.
(Continued)

FOREIGN PATENT DOCUMENTS

JP    2003-523646 A    8/2003
JP    2010-273095 A    12/2010
(Continued)

OTHER PUBLICATIONS

International Search Report dated Dec. 24, 2013, issued in corresponding application No. PCT/JP2013/006820.

*Primary Examiner* — Tuan Ho
(74) *Attorney, Agent, or Firm* — Westerman, Hattori, Daniels & Adrian, LLP

(57) ABSTRACT

An image sensor includes: a pair of light receiving elements which is disposed for each of two-dimensionally aligned lenses and receives light from a subject, one of the light receiving elements outputting a pixel signal constituting one of captured images in a pair, the other of the light receiving elements outputting a pixel signal constituting the other of the captured images in a pair, the captured images in a pair having a parallax for displaying a three-dimensional captured image of the subject; and a wiring layer disposed between the light receiving elements, the wiring layer including a plurality of wiring lines laminated spaced apart from one another for transmitting an input or output signal to and from the light receiving elements, in which the wiring layer shields light that otherwise goes beyond one picture element to be incident onto another picture element.

12 Claims, 10 Drawing Sheets

(51) Int. Cl.
*H01L 27/146* (2006.01)
*H04N 5/369* (2011.01)

(58) Field of Classification Search
CPC . G06T 2207/10004; G06T 2207/10148; G06T 2207/2207; G06T 2207/20221
See application file for complete search history.

(56) References Cited

U.S. PATENT DOCUMENTS

| | | |
|---|---|---|
| 2011/0279727 A1 | 11/2011 | Kusaka |
| 2012/0212662 A1 | 8/2012 | Shimoda et al. |
| 2013/0135505 A1* | 5/2013 | Yoshida ............ H01L 27/14618 348/311 |
| 2013/0161774 A1 | 6/2013 | Okigawa |

FOREIGN PATENT DOCUMENTS

| | | | |
|---|---|---|---|
| JP | 2011-515045 A | | 5/2011 |
| JP | 2011-176715 A | | 9/2011 |
| JP | 2012-173492 A | | 9/2012 |
| JP | 2012-211942 A | | 11/2012 |
| WO | 2012/026292 A1 | | 3/2012 |

* cited by examiner

IMAGE SENSOR AND IMAGING DEVICE

CROSS REFERENCE TO RELATED APPLICATIONS

The present application is a Continuing Application based on International Application PCT/JP2013/006820 filed on Nov. 20, 2013, which, in turn, claims the priority from Japanese Patent Application No. 2012-255461 filed on Nov. 21, 2012, and the entire disclosures of the Japanese Patent Application and the International Application are incorporated herein by reference.

TECHNICAL FIELD

This disclosure relates to an image sensor provided with a pair of light receiving elements arranged for each of two-dimensionally aligned lenses so as to respectively output pixel signals constituting either one of captured images that are in a pair and have a parallax, and an imaging device including the image sensor.

BACKGROUND

As a configuration of using a single image sensor for imaging a pair of captured images having a parallax for displaying a three-dimensional captured image, it has been known to include a right-and-left pair of light receiving elements for each of two-dimensionally aligned microlenses, so that a captured image for the left eye is formed based on pixel signals obtained from the light receiving element for the left eye while a captured image for the right eye is formed based on pixel signals obtained from the light receiving element for the right eye. Examples of such image sensor are described in JP2011-515045A (PTL 1), JP2003-523646A (PTL 2), and JP2011-176715A (PTL 3).

CITATION LIST

Patent Literature

PTL 1: JP2011-515045A
PTL 2: JP2003-523646A
PTL 3: JP2011-176715A

According to the aforementioned image sensor, when the three-dimensional image is divided into a picture element composed of a pair of pixels having a parallax, each of the microlenses and the pair of light receiving elements associated therewith correspond to the picture element while each of the light receiving elements corresponds to a pixel in each of the captured images. Here, the microlens may receive a light beam incident at a large incident angle when, for example, the imaging lens has a large numerical aperture and a small F number on the image side. Then, if the light beam that has passed through the microlens corresponding to one picture element is incident on the light receiving element corresponding to the adjacent picture element, there is a fear of causing such problems as degradation in precision of the pixel signal which may lead to deterioration in the resolution of the resulting three-dimensional captured image and as crosstalk generated between a pair of captured images which may degrade the stereoscopic effect in the resulting three-dimensional captured image.

SUMMARY

It could therefore be helpful to provide: an image sensor capable of preventing deterioration in the resolution of the three-dimensional captured image and degradation in the stereoscopic effect thereof; and an imaging device including the image sensor.

In order to solve the aforementioned problems, the image sensor includes: a pair of light receiving elements which is disposed for each of two-dimensionally aligned lenses and configured to receive light from a subject, such that one of the light receiving elements is configured to output a pixel signal constituting one of captured images in a pair, and the other of the light receiving elements is configured to output a pixel signal constituting the other of the captured images in a pair, the captured images in a pair having a parallax for displaying a three-dimensional captured image of the subject; and a wiring layer disposed between the light receiving elements, such that the wiring layer includes a plurality of wiring lines laminated spaced apart from one another, the wiring lines for transmitting an input signal or an output signal to and from the light receiving elements.

According to a preferred aspect, the lenses each have a curvature radius of r, the lenses are disposed at intervals of p, the lens and the distal surface of the wiring layer in the laminating direction has a medium disposed therebetween, the medium having an average refractive index of nav2, and the wiring layer has a distance hb measured from the light receiving surface of the light receiving element to the distal surface of the wiring layer in the laminating direction, the curvature radius r, the interval p, the average refractive index nav2, and the distance hb satisfying the relation of $1.4 \leq (1/p) \cdot [r/(nav2-1)-hb] \leq 3$.

According to another preferred aspect, in the aforementioned image sensor, the wiring layer is disposed between the light receiving element pairs.

According to still another aspect, in the aforementioned image sensor, at least one of the plurality of wiring layers is made of one of aluminum and copper.

According to yet another aspect, in the aforementioned image sensor, the wiring lines of the wiring layers are laminated in such a manner as to shield light that would otherwise go beyond the lens to be incident onto the light receiving element associated with another lens adjacent to the lens.

It could also be helpful to provide an imaging device including: the aforementioned image sensor; and a display for displaying a three-dimensional image based on the aforementioned captured images in a pair.

An embodiment illustrated in below may allow for preventing deterioration in the resolution of the three-dimensional captured image and degradation in the stereoscopic effect thereof.

DETAILED DESCRIPTION

An embodiment is disclosed in below.

Figure 1:
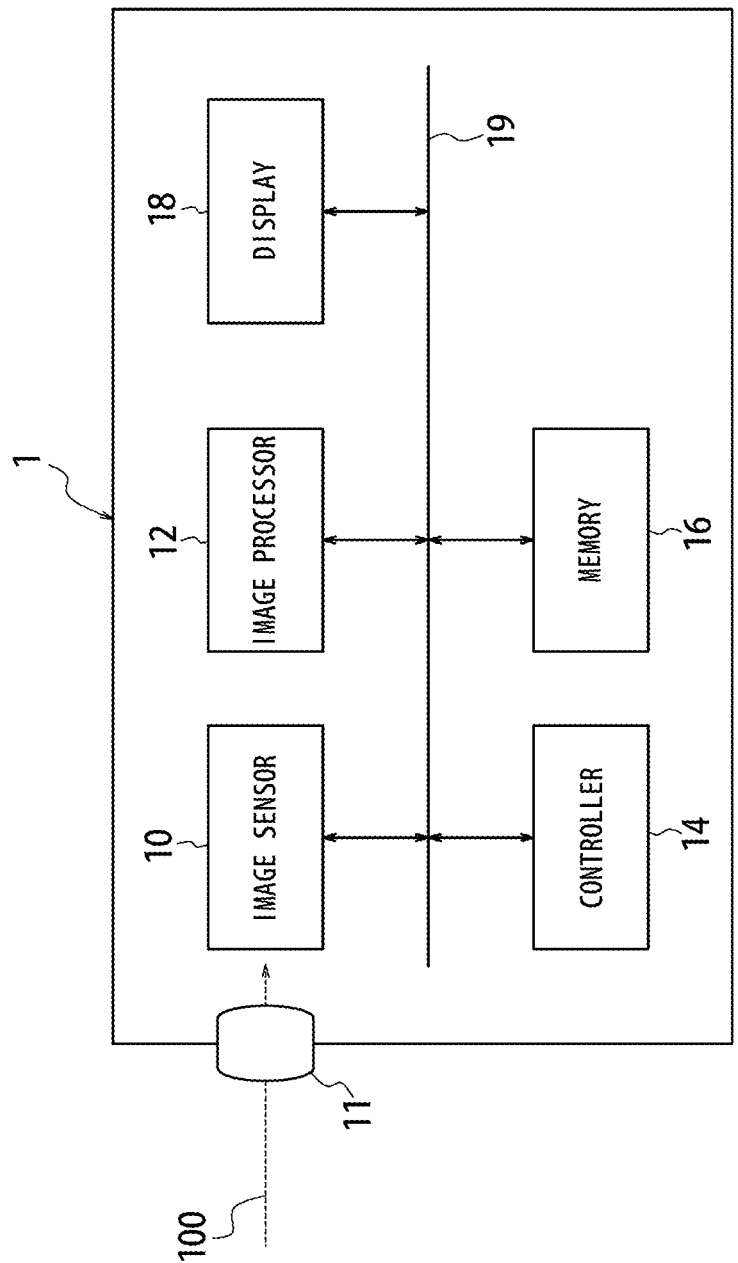
FIG. 1 is a block diagram illustrating a schematic configuration of an imaging device of an embodiment disclosed herein.

FIG. 1 is a block diagram illustrating a schematic configuration of an imaging device of the embodiment. The imaging device 1 captures, based on subject light 100 from a subject, a pair of captured images having a parallax for displaying a three-dimensional image. The imaging device 1 includes: an imaging lens 11; an image sensor 10; an image processor 12; a controller 14; a memory 16; and a display 18. The image sensor 10, the image processor 12, the controller 14, the memory 16, and the display 18 are connected to a bus 19 and configured to be capable of mutually transmitting and receiving various signals.

When the subject light 100 is incident through the imaging lens 11, the image sensor 10 captures, based on the subject light 100, a pair of left-eye and right-eye captured images having a parallax, and outputs pixel signals constituting each of the captured images. The captured images are each composed of two-dimensionally aligned pixels. One frame of the captured image may include, for example, 640×480 pixels to 4000×3000 pixels, but the number of pixels is not limited to such range. The image sensor 10 may be a complementary metal oxide semiconductor (CMOS) or a charge coupled device (CCD) having light receiving elements disposed in association with respective pixels, and generates pixel signals by means of the light receiving elements and outputs the signals. The pixel signals may be generated and output, for example, for each one frame. The pixel signals may be those each representing a gradation value of each color of, for example, red (R), green (G), blue (B), for each pixel. The pixel signal may also be, for example, a digital signal obtained through A/D conversion of a signal output from the light receiving element.

The image processor 12 subjects captured image data which include pixel signals for one frame, to predetermined image processing such as color and luminance correction, and to data compression/decompression. The image processor 12 subjects captured image data for one frame to image processing. The image processor 12 may be, for example, a digital signal processor (DSP) or an application specific integrated circuit (ASIC).

The memory 16 is a frame memory for storing captured image data that is to be image-processed and/or has been image-processed. The memory 16 may be, for example, a static random access memory (SRAM) or a dynamic RAM (DRAM). Alternatively, the memory 16 may include a data reading/writing device to various storage media, such as a hard disk or a portable flash memory.

Based on the captured image data, the display 18 displays a three-dimensional image. The display 18 may include, for example, a liquid crystal display (LCD) and a control circuit thereof, the LCD being provided with a polarization filter corresponding to the parallax between the right eye and the left eye. The display 18 displays data on right and left captured images having a parallax, so as to display a three-dimensional image that allows a user to perceive a stereoscopic effect.

The controller 14 sends a control signal to the image sensor 10, the image processor 12, the memory 16, and the display 18, so as to control the operation of the imaging device 1 in an integrated manner. The controller 14 may be, for example, a microcomputer.

Figure 2:
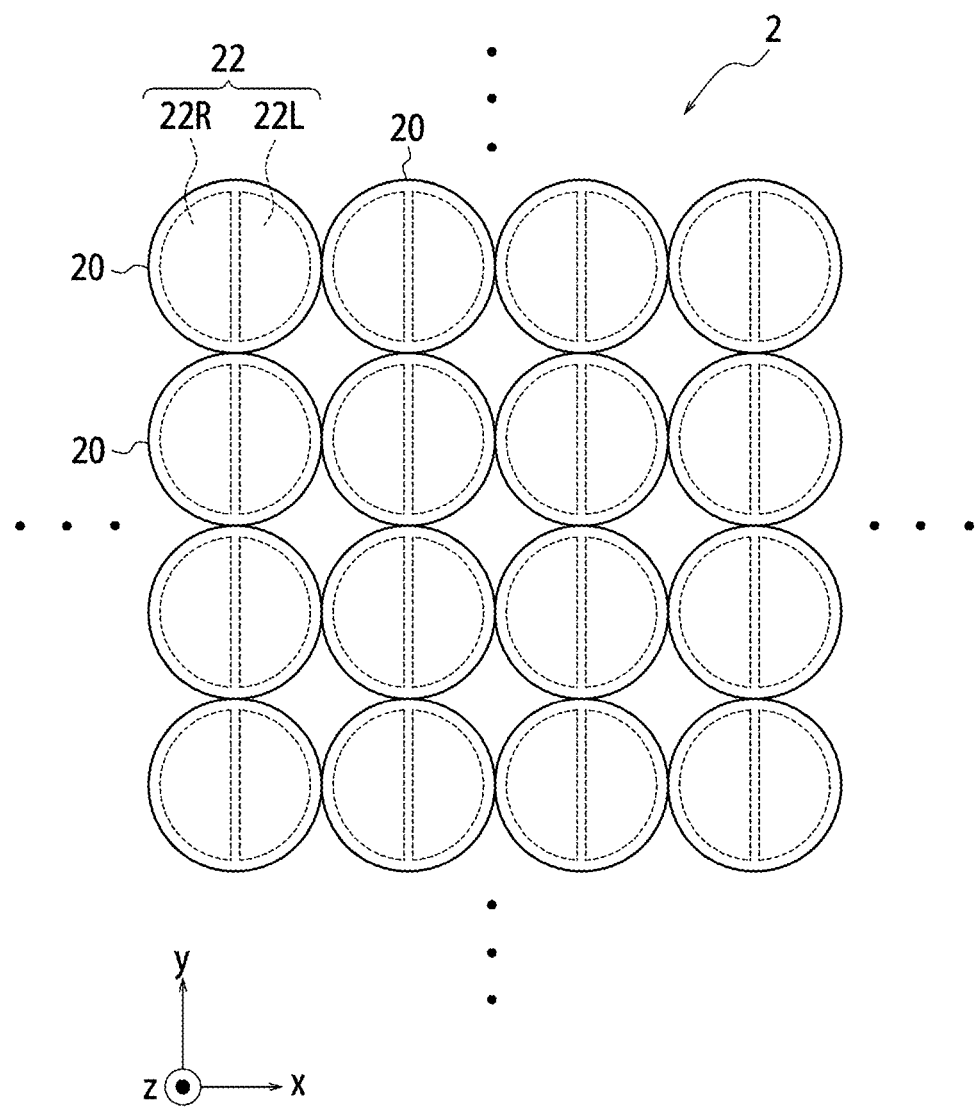
FIG. 2 is a diagram for illustrating a part configuration of the imaging device.
Figure 3:
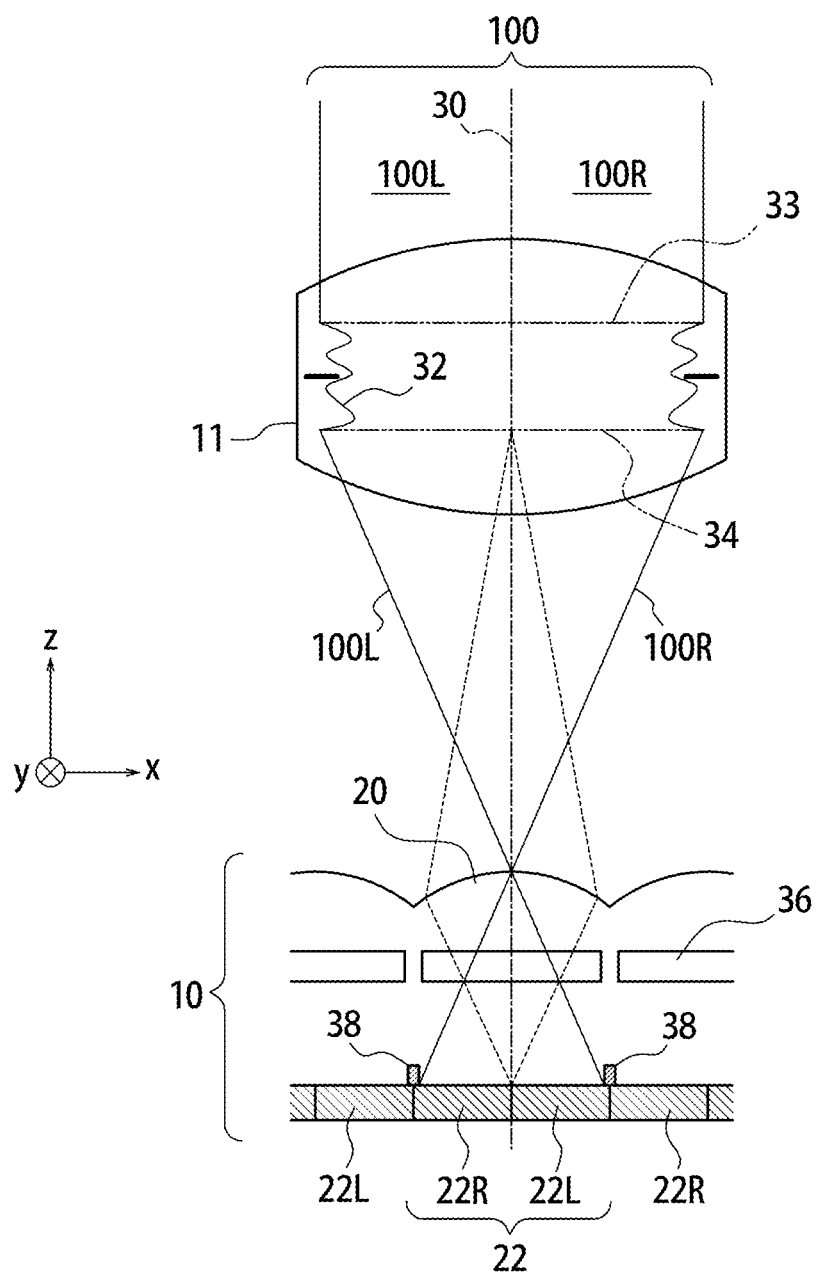
FIG. 3 is a diagram for illustrating the part configuration of the imaging device.

FIGS. 2 and 3 each are a diagram for illustrating a part configuration of the image sensor 10.

As illustrated in FIG. 2, the image sensor 10 has a lens group 2 composed of two-dimensionally aligned spherical microlenses 20. The microlenses 20 are disposed as corresponding to picture elements of a three-dimensional image. In FIG. 2, the X-axis direction corresponds to the lateral direction of the captured image while the Y-axis direction corresponds to the vertical direction of the captured image. Meanwhile, the Z-axis direction corresponds to the optical axis direction.

The image sensor 10 further includes a light receiving element pair 22 arranged for each of the microlenses 20. In FIG. 2, only some microlenses in the lens group 2 are illustrated with the light receiving element pairs 22, for the sake of convenience. The light receiving element pairs 22 each include: a light receiving element 22L; and a right receiving element 22R, where the light receiving element 22L is for generating and outputting pixel signals which constitute a left-eye captured image, and the light receiving element 22R is for generating and outputting pixel signals which constitute a right-eye captured image, the left-eye captured image and the right-eye captured image constituting a captured image pair having a parallax for displaying a three-dimensional captured image. The light receiving elements 22L, 22R are arranged adjacent to each other in the X-axis direction or in the lateral direction. The light receiving elements 22L, 22R are each associated with a pixel in each of the captured images in a pair for use in displaying a three-dimensional captured image.

FIG. 3 is a sectional view of the image sensor 10 along the Z-axis direction. As illustrated in FIG. 3, the subject light 100 is incident on the image sensor 10 through the imaging lens 11. The subject light 100 passes through the imaging lens 11 via an incident pupil 33 and an exit pupil 34 each having a diameter corresponding to that of a stop 32. The subject light 100 that has passed through the imaging lens 11 is condensed for each of the microlenses 20, so as to form a subject image, via a color filter 36, on the light receiving elements 22L, 22R of the light receiving element pair 22. The color filter 36 has either one of the colors of R, G, B for each picture element. Accordingly, light of either one of the colors of R, G, B is incident on the light receiving elements 22L, 22R, so as to form a subject image.

In each picture element, the subject light 100 has a light flux 100L on the left and a light flux 100R on the right relative to the optical axis 30, the light flux 100L on the left being incident on the light receiving element 22L for the left eye, the light flux 100R being incident on the light receiving element 22R for the right eye. Then, the light receiving element 22L generates and outputs pixel signals for pixels constituting the left-eye captured image. On the other hand, the light receiving element 22R generates and outputs pixel signals for pixels constituting the right-eye captured image. The light receiving elements 22R, 22L may be, for example, a photodiode included in a CMOS or a CCD.

Disposed between the light receiving element pairs 22 adjacent to each other is a wiring layer 38 obtained by laminating a wiring line for transmitting an input signal or an output signal to and from the light receiving element 22R or 22L. A function of the wiring layer 38 is described in below with reference to FIGS. 4, 5.

Figure 4:
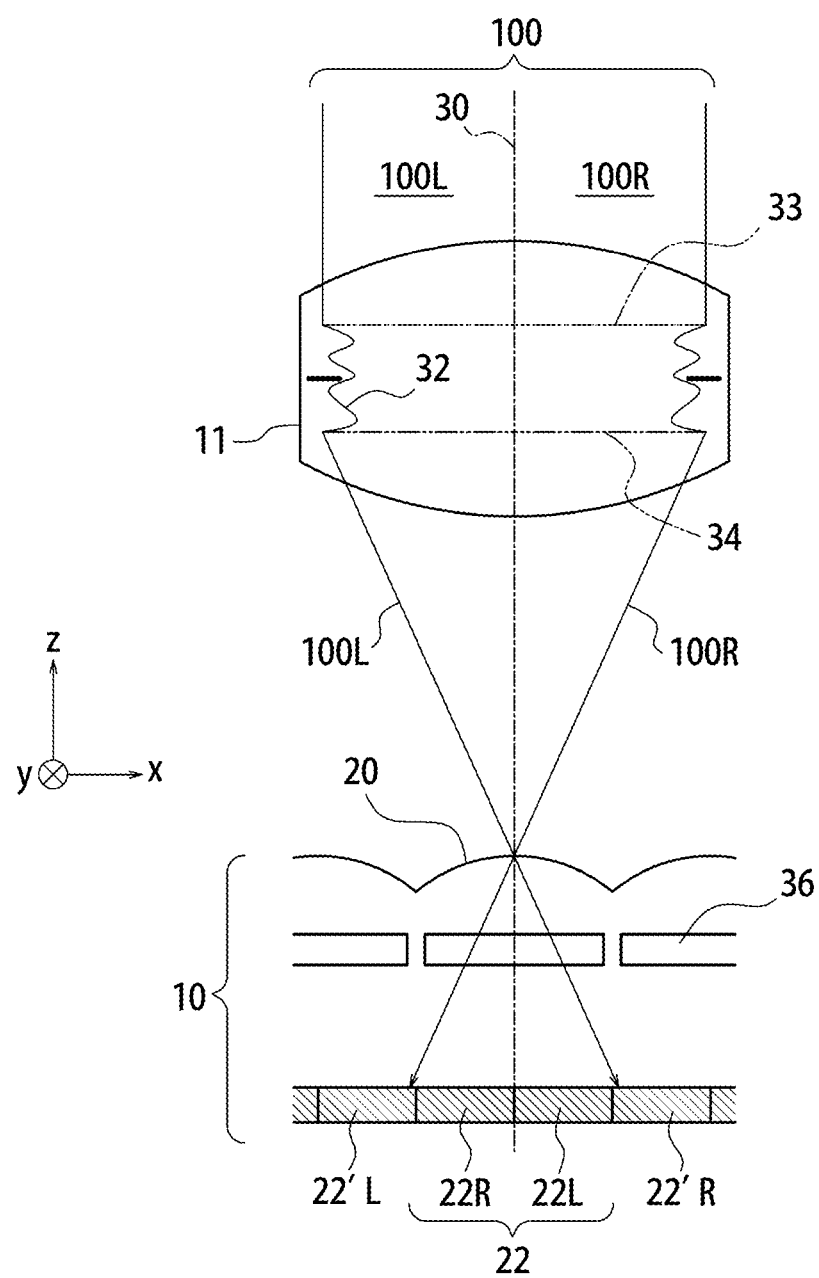
FIG. 4 is a diagram for illustrating a function of wiring layers.

FIG. 4 is a sectional view of the image sensor 10 without the wiring layers 38 of FIG. 3. The components that are in common with those of FIG. 3 are denoted by the same reference symbols as in FIG. 3. FIG. 4 illustrates an exemplary case where the imaging lens 11 has a large numerical aperture (i.e., a small F number) on the image side. In this case, some of the light beams incident on the microlens 20 have a large incident angle. Here, taking a closer look at the light receiving element pair 22 for one picture element, a light flux 100L on the left may go beyond the light receiving element 22L for the left eye to be incident on the light receiving element 22'R for the right eye in another picture element adjacent to the said picture element, and a light flux 100R on the right may go beyond the light receiving element 22R to be incident on the light receiving element 22'L for the left eye in further another picture element again adjacent to the said picture element. As a result, a separate color of light that is incident on each picture element will be mixed with a light flux that has passed through the color filter 36 of a color different from the color originally associated with the picture element, causing color unevenness in the captured image as a whole. Further, the light flux incident on the microlens 20 for each picture element will be translated into light on the adjacent picture element, which leads to deterioration in resolution. Those phenomena may result in the following problems: that is, the three-dimensional image may suffer deterioration in resolution, or crosstalk may be generated between the right and left captured images, leading to degradation of the stereoscopic effect in the resulting three-dimensional captured image. In view of the above, this embodiment includes the wiring layers 38 which function as follows.

Figure 5:
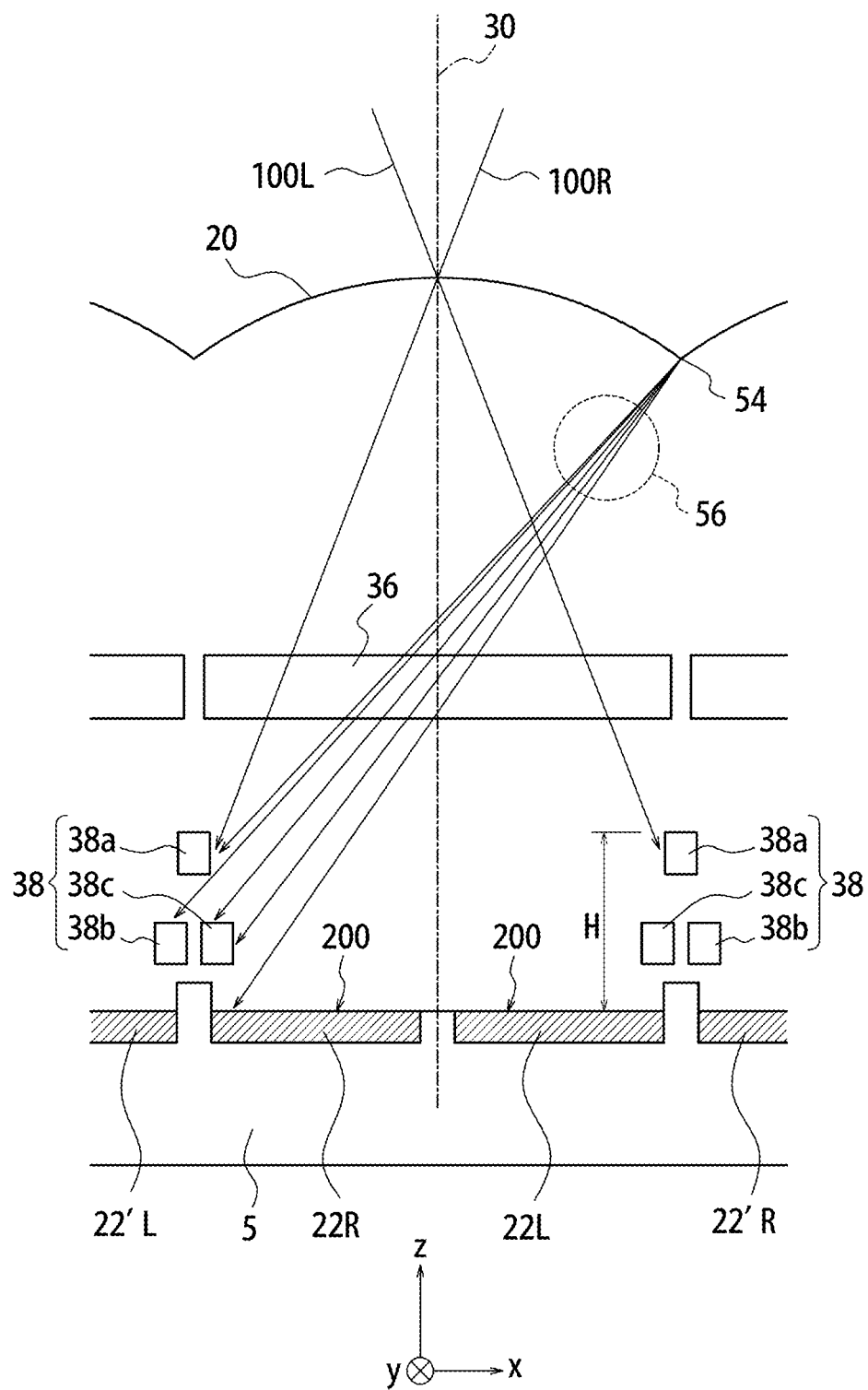
FIG. 5 is a diagram for illustrating the function of the wiring layers.

FIG. 5 is an enlarged view of the wiring layers 38 in the sectional view of FIG. 3. The components that are in common with those of FIG. 3 are denoted by the same reference symbols as in FIG. 3. According to this embodiment, which includes the wiring layers 38, the light fluxes 100L, 100R are each shielded by the wiring layers 38 before going beyond the light receiving elements 22L, 22R, respectively, with the result that the light fluxes 100L, 100R can be prevented from being incident on the picture elements 22'R, 22'L constituting other picture elements adjacent thereto.

Another example is also illustrated herein, in which the wiring layer 38 includes wiring lines 38a, 38b, and 38c laminated on a Si substrate 5. The wiring lines 38a, 38b, and 38c each serve as a ground wiring line or a transmission wiring line for transmitting line or column selection signals for selecting which of the light receiving elements to output the pixel signal and for transmitting the pixel signal to be output. In the illustrated example, three wiring lines are depicted by way of example. However, the number of the wiring lines is not limited to three as long as it is two or more. The wiring lines 38a, 38b, and 38c of the wiring layer 38 may be laminated spaced apart from one another in the laminating direction. The wiring lines 38a, 38b and 38c may all be spaced apart from one another, or any two lines may be in contact with each other. Further, the wiring lines may be spaced apart at least in part in the extending direction of the wiring lines. The wiring lines 38a to 38c are made of metal. Light fluxes reaching the wiring layer 38 including the metal wiring lines 38a to 38c may be reflected and scattered, but do not pass through the wiring layer 38 despite that the wiring lines 38a, 38b, and 38c are spaced apart from one another in the laminating direction.

For example, referring to FIG. 5, light 56 incident from the proximity of a right end 54 of the microlens 20 has a larger incident angle relative to the optical axis 30 as compared with that of the light flux 100R incident from near the optical axis 30. The light 56, which is incident on the wiring layer 38 between the light receiving elements 22R, 22'L diagonally from the upper right direction, is shielded by the wiring lines 38a, 38b, and 38c before reaching the light receiving element 22'L. In this manner, the wiring layer 38 is capable of preventing a light flux that has passed the microlens 20 to reach the wiring layer 38 from directly reaching the light receiving elements 22L, 22R of the adjacent picture elements. It should be noted that, in this example, the space from the microlens 20 to a light receiving surface 200 of the light receiving elements 22L, 22R is filled with a medium such as an organic material and $SiO_2$, with no air layer provided therein.

According to a preferred aspect, the wiring lines 38a to 38c may be made of aluminum having a light shielding property. This configuration allows for reliably shielding light. However, the wiring lines 38a to 38c may also be made of copper allowing the transmission of some light, as long as the wiring layer 38 is provided with a certain height H (corresponding to the distance between the surface of the substrate 5 and a most distal surface of the wiring layer 38 therefrom in the Z-axis direction) sufficient enough to correspondingly compensate for the loss in light shielding property.

In this embodiment, the aforementioned function of the wiring layer 38 allows for preventing, in each picture element, the mixing of a light flux of the adjacent picture element into the light of the said picture element, without the need of providing any additional light shielding configuration such as an aluminum partition wall between the light receiving elements of the image sensor. Accordingly, there can be manufactured an imaging device capable of avoiding deterioration in the resolution and the stereoscopic effect in the three-dimensional captured image, without the need for additional manufacturing process for providing an additional configuration.

Figure 6:
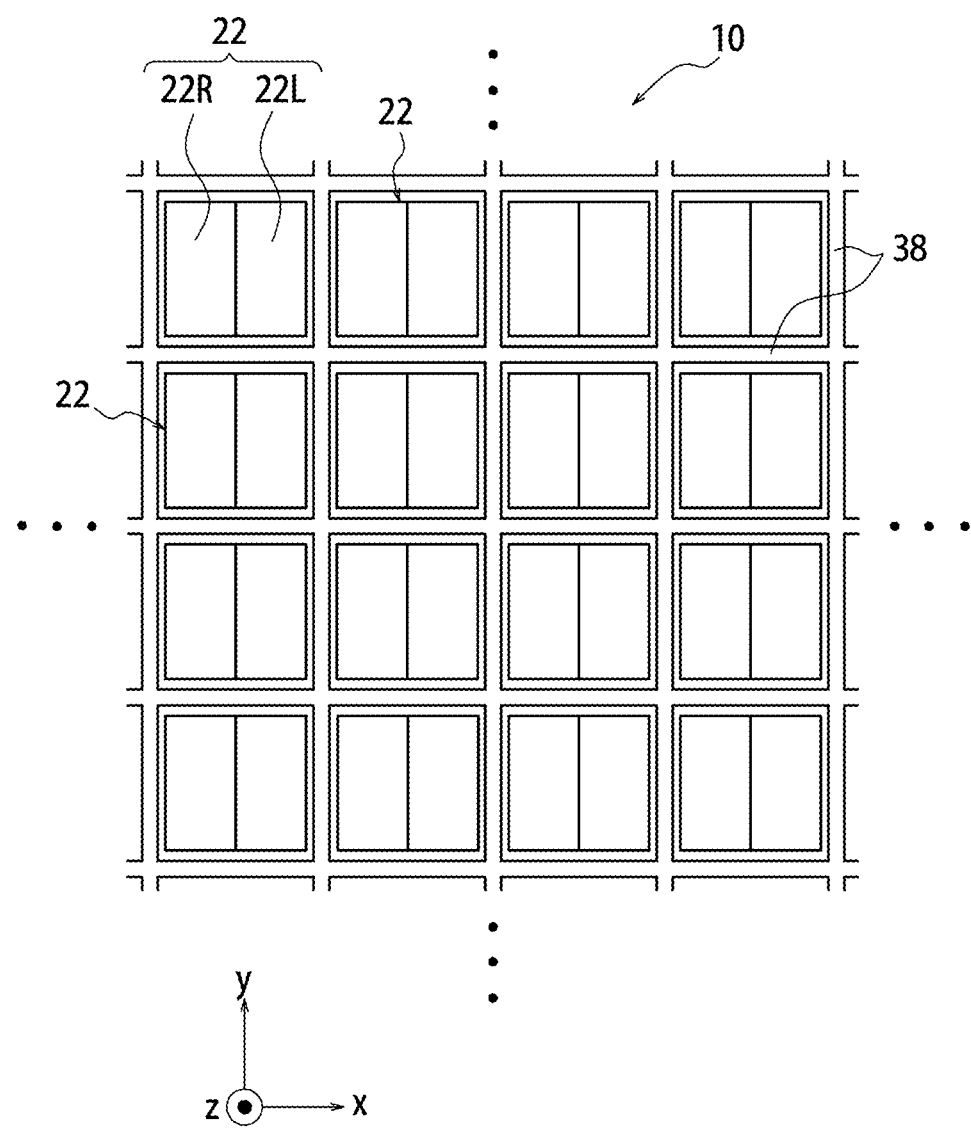
FIG. 6 is a diagram illustrating how the wiring layers are disposed.

FIG. 6 shows the image sensor 10 with the wiring layer 38 disposed on the X-Y plane. FIG. 6 illustrates the light receiving elements 22R, 22L arranged in a grid pattern. The light receiving element may be in any shape, without being limited to the shape illustrated therein. In FIG. 6, the cell including a pair of the light receiving elements 22R, 22L serves as the light receiving element pair 22 that corresponds to one picture element. As illustrated in FIG. 6, the wiring layer 38 is disposed between the light receiving pairs 22 adjacent to each other in the X-axis direction (or in the lateral direction of the captured image). With this configuration, the left and right light fluxes 100L, 100R in each picture element can be prevented from being respectively incident on the light receiving elements 22R, 22L for the right and left eyes of another picture element adjacent to the said picture element. The wiring layer 38, which may be disposed either for every two or more light receiving element pairs 22 in the X-axis direction or for every random number of the light receiving element pairs 22, may preferably be disposed for every one of the light receiving element pairs 22 as illustrated in FIG. 6. Further, the wiring layer 38 can also be disposed between the light receiving elements 22R, 22L in the light receiving pair 22. This configuration contributes to preventing deterioration in the resolution and in the stereoscopic effect of the resulting three-dimensional captured image.

In the Y-axis direction (or in the vertical direction of the captured image), the wiring layer 38 may be disposed between the light receiving elements 22L or the light receiving elements 22R of the adjacent picture elements. With this configuration, the light can be prevented from going out of each picture element in the vertical direction to be incident on another picture element adjacent to the said picture element. Accordingly, this configuration can prevent a situation where the resulting captured image suffers reduced resolution due to the incidence of light of the vertically-adjacent picture elements, which thus leads to reduction in the resolution of the resulting three-dimensional captured image. The wiring layer 38 may be disposed, in the Y-axis direction, for every two or more light receiving elements 22L or 22R, or for every arbitrary number of the light receiving elements 22L or 22R. However, the wiring layer 38 may preferably be disposed for each one of the light receiving element 22L or 22R as illustrated in FIG. 6. This configuration can more effectively prevent reduction in the resolution of the resulting three-dimensional captured image.

Here, the light receiving elements, which are aligned in the column direction and in the row direction in the illustrated example, may also be aligned in a honeycomb structure without departing from this embodiment.

Figure 7:
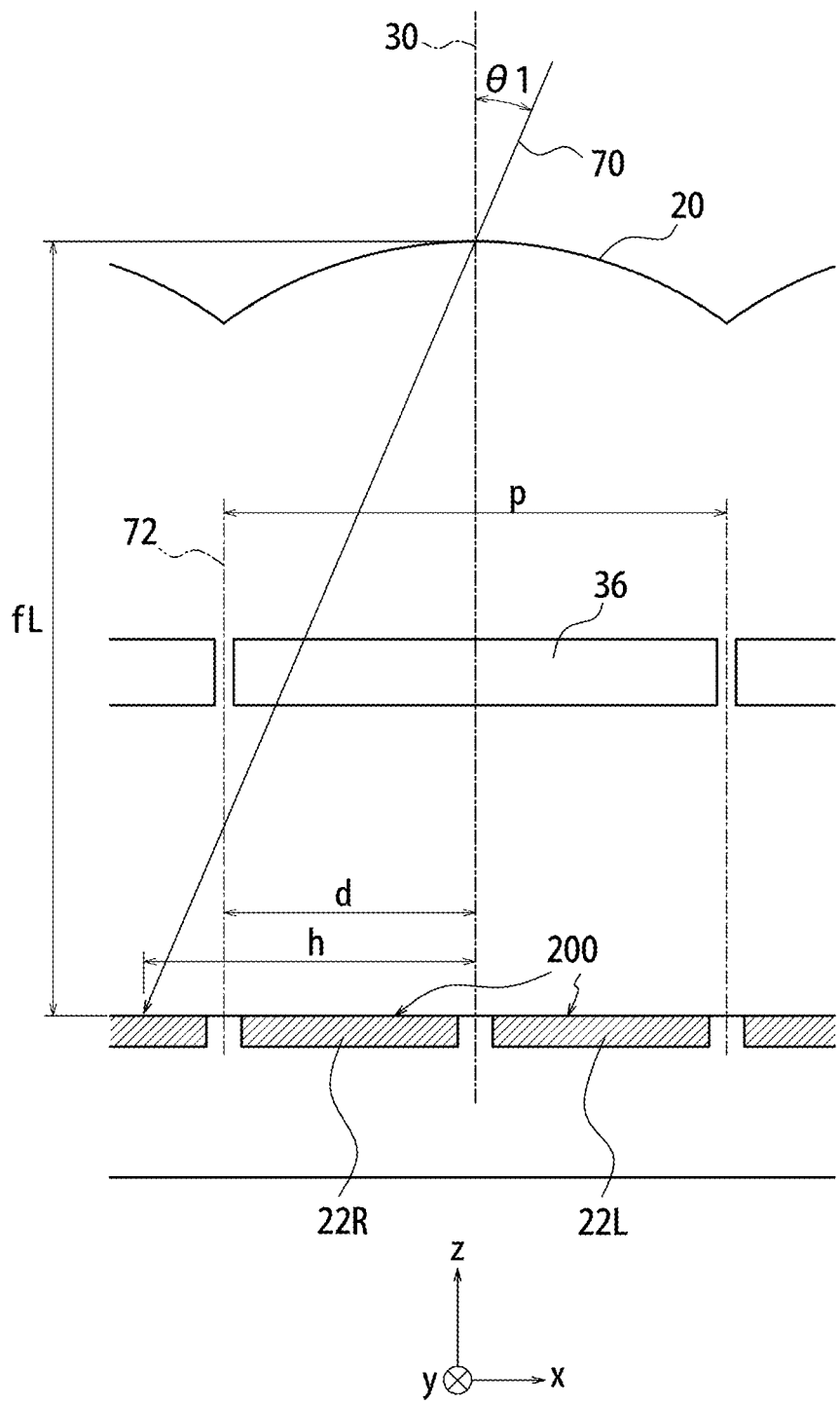
FIG. 7 is a diagram for illustrating about a suitable height of the wiring layers.
Figure 8:
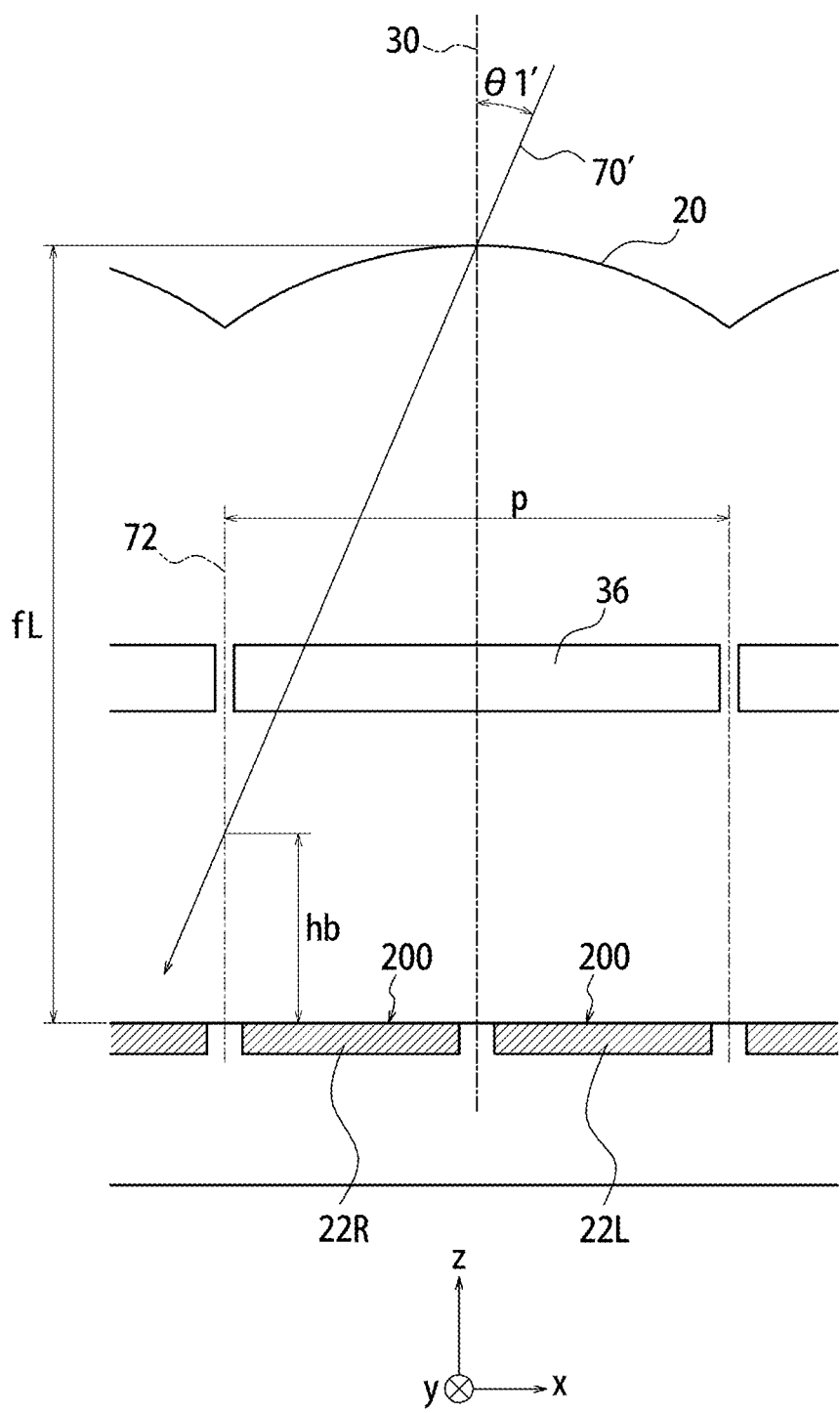
FIG. 8 is a diagram for illustrating about a suitable height of the wiring layers.

Here, referring to FIGS. 7, 8, a description is given of a preferable height of the wiring layer 38. FIGS. 7 and 8 each illustrate a part of the image sensor 10 shown in the sectional view of FIG. 5, with the omission of the wiring layer 38 therefrom.

First, with reference to FIG. 7, a description is given of the condition under which a light in a picture element is caused to be incident on a light receiving element of another picture element adjacent to the said picture element. In FIG. 7, the components that are in common with those of FIG. 5 are denoted by the same reference symbols as in FIG. 5.

When a light flux 70 passes through the maximum point of the ray height at the exit pupil 34 of the imaging lens 11 to be incident on the vertex of the microlens 20 at an incident angle θ1 relative to the optical axis 30, and the imaging lens 11 has a F number of Fn, the following Equation (1) holds for the incident angle θ1 and the F number of Fn.

$$\tan\theta 1 = 1/(2 \cdot Fn) \quad \text{Equation (1):}$$

Then, the microlens 20 has a focal length fL, which is represented by the following Equation (2), where r stands for the curvature radius of the microlenses 20 and nav stands for the average refractive index of the medium disposed in the space from the microlens 20 to the light receiving surface 200 of each the light receiving elements 22L, 22R.

$$fL = r/(nav-1) \quad \text{Equation (2):}$$

Here, the light receiving surfaces 200 of the light receiving elements 22L, 22R are each disposed approximately at the back focal point of the microlens 20. The imaging lens 11 is configured to have, for example, the exit pupil 34 positioned near infinity. Thus, the image at the exit pupil 34 of the imaging lens 11 passes through the microlens 20 to be imaged on the light receiving surfaces 200 of the light receiving elements 22L, 22R. In this case, the light flux 70 incident on the microlens 20 at the incident angle θ1 has a distance h from the optical axis 30, on the light receiving surfaces 200 of the light receiving elements 22L, 22R, the distance h being represented by the following Equation (3).

$$h = fL \cdot \tan\theta 1 \quad \text{Equation (3):}$$

Meanwhile, a distance d from the optical axis 30 of the microlens 20 to a boundary 72 to another microlens 20 of the adjacent picture element is represented by the following Equation (4), where p represents the pitch of the microlenses 20.

$$d = p/2 \quad \text{Equation (4):}$$

Here, when h is larger than d (h>d: Equation (5)), the light flux 70 having passed through the microlens 20 of one picture element reaches a position beyond the distance d from the optical axis 30 so as to be incident on the light receiving element of another picture element adjacent to the said picture element, though depending on the aperture ratios of the light receiving elements 22L, 22R.

Therefore, based on the Equations (1) to (5), the condition for causing a light in a picture element to be incident on a light receiving element of another picture element adjacent to the said picture element is represented by the following Expression (6).

$$r/[Fn \cdot (nav-1)] > p \quad \text{Expression (6):}$$

In Expression (6),
Fn: F number of the imaging lens 11
r: the curvature radius of the microlens 20,
nav: the average refractive index of the medium disposed in the space from the microlens 20 to the light receiving surface 200 of each of the light receiving elements 22R, 22L, and
p: the pitch of the microlenses 20.

Next, with reference to FIG. 8, a description is given of a height of the wiring layer 38 that may prevent the light flux 70 of a picture element from reaching another picture element adjacent to the said picture element. In FIG. 8, the components in common with those of FIG. 7 are denoted by the same reference symbols as in FIG. 7.

Assuming that a light flux 70' having passed though the exit pupil 34 of the imaging lens 11 at a position furthest from the optical axis 30 is incident on the vertex of the microlens 20 at an incident angle θ1', the light flux 70' passes across the boundary 72 between the picture elements at a height hb from the light receiving surfaces 200 of the light receiving elements 22L, 22R. In this case, the following Equation (7) is established, where nav2 represents the average refractive index of the medium disposed from the vertex of the microlens 20 to the height hb.

$$[r/(nav2-1)-hb] \cdot \tan\theta 1' = p/2 \quad \text{Equation (7):}$$

Accordingly, the height of the wiring layer 38 may be so defined as to shield the light flux, to thereby allow no light flux to reach the adjacent picture element. In other words, the height of the wiring layer 38 may be defined to be at least hb in the following Equation (8), which is derived from Equation (7).

$$hb = r/(nav2-1) - p \cdot Fn \quad \text{Equation (8):}$$

Here, the value of Fn of the most brightest imaging lenses 11 for use may be substituted into the Equation (8) above, so as to obtain the height needed for of the wiring layer 38. In this manner, there may be disposed the wiring layer 38 having a height equal to or higher than the hb above may be disposed, so as to prevent a light flux that has passed through the microlenses 20 from reaching another adjacent picture element.

In contrast, when the height hb of the wiring layer 38 is predetermined, the F number of the most brightest imaging lens 11 that can be used may be obtained by the following Equation (9) which is modified from the Equation (8) above.

$$Fn = (1/p) \cdot [r/(nav2-1) - hb] \quad \text{Equation (9):}$$

EXAMPLES

Example 1 as to Height of Wiring Layer 38

In Example 1, the parameters of the following elements are defined as follows:
the curvature radius of the microlens 20: r=0.01 mm (spherical surface);
the pitch of the microlenses 20: p=0.01 mm;
the average refractive index of the medium disposed in the space from the microlens 20 to the upper surface (most distal surface from the light receiving surface 200) height of the wiring layer 38: nav2=1.5;

the average refractive index of the medium from the microlens 20 to the light receiving surfaces 200 of the light receiving elements 22L, 22R: nav=1.5; and the height of the wiring layer 38: hb=0.006 mm.

Here, the wiring layer 38 is made of metal such as aluminum, and substantially non-transparent against light. In Example 1, according to Equation (9), the imaging lens 11 with the brightness up to F1.4 may be used without allowing any light flux to reach the light receiving element of the adjacent picture element. Therefore, the imaging lens 11 of F1.4, which is a relatively bright lens, may be used without causing any problems such as degradation in the resolution and the color deviation of the resulting three-dimensional captured image.

Example 2 as to Lamination of Wiring Lines of Wiring Layer 38

Figure 9:
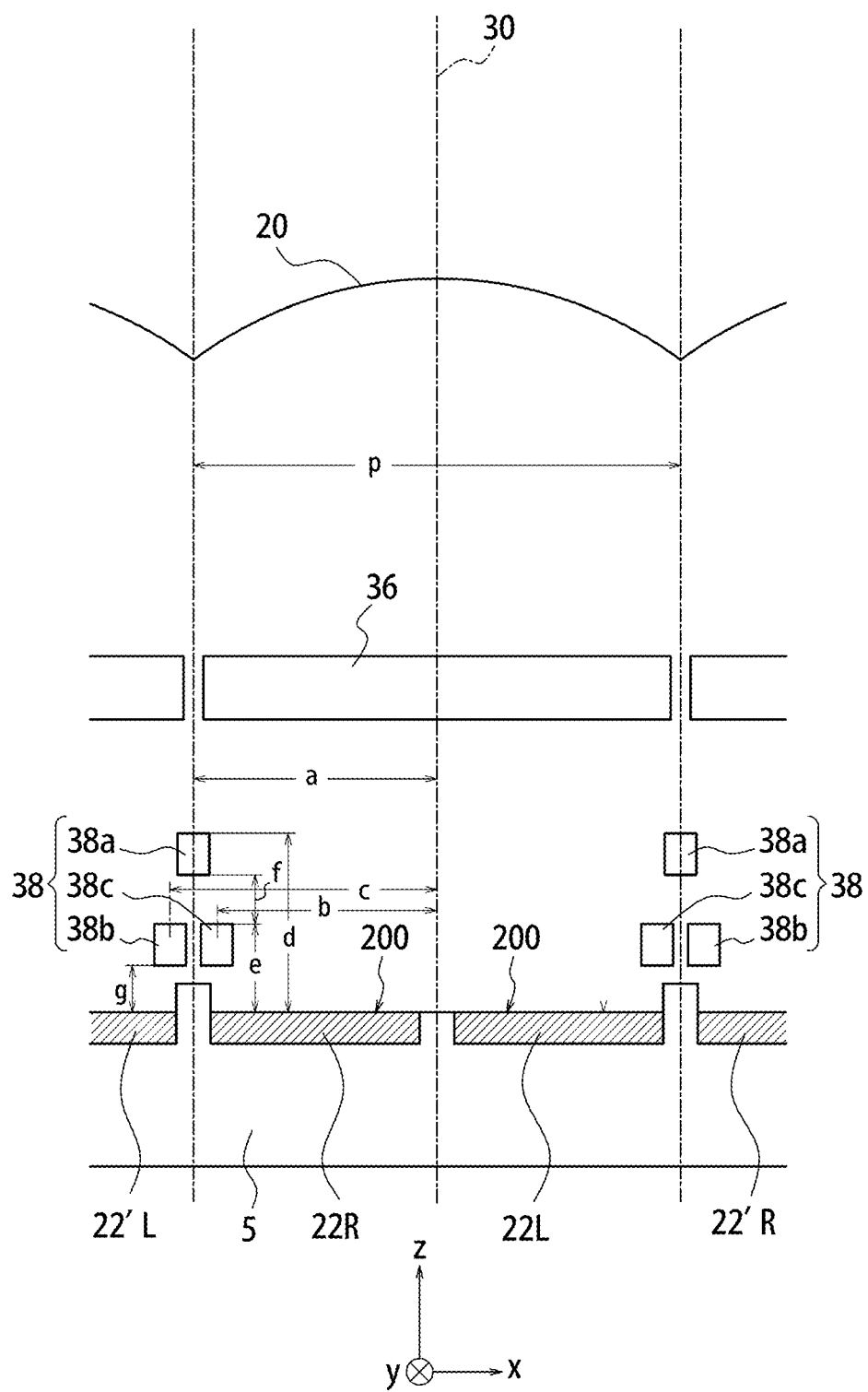
FIG. 9 is a diagram for illustrating Example as to how the wiring layers are laminated.

FIG. 9 illustrates Example 2 as to how to laminate the wiring lines of the wiring layer 38. In Example 2, the wiring layer 38 includes the wiring lines 38a, 38b, and 38c, which are disposed at intervals shown in a sectional view of the image sensor 10. For example, the wiring lines 38b and 38c are disposed in parallel to each other and the wiring line 38a is laminated thereon, in which the wiring lines 38a, 38b, and 38c each have, in section thereof, a dimension of 1 μm in the X-axis direction while having a dimension of 1.3 μm in the Z-axis direction. It should be noted that the curvature radius r and the pitch p of the microlenses 20, the average refractive index nav2 of the medium disposed in the space from the microlens 20 to the upper surface height of the wiring layer 38, the average refractive index nav of the medium disposed in the space from the microlens 20 to the light receiving surfaces 200 of the light receiving elements 22L, 22R, and the height hb of the wiring layer 38 are the same as those of Example 1.

In this case, the wiring lines 38a, 38b, and 38c may be disposed so as to satisfy the following conditions:

the distance from the optical axis 30 to the center of the wiring line 38a: a=5 μm;

the distance from the optical axis 30 to the center of the wiring line 38c of the wiring lines 38b and 38c that is closer to the optical axis 30: b=4 μm;

the distance from the optical axis 30 to the center of the wiring line 38b of the wiring lines 38b and 38c that is farther from the optical axis 30: c=6 μm;

the distance from the light receiving surface 200 to the upper surface of the wiring line 38a: d=6 μm;

the distance from the light receiving surface 200 to the upper surface of the wiring line 38b (38c): e=3.5 μm;

the distance from the lower surface (a most proximal surface from the light receiving surface 200) of the wiring line 38a to the upper surface of the wiring line 38b (38c): f=1.5 μm; and the distance from the light receiving surface 200 to the lower surface of the wiring line 38b (38c): g=1.9 μm, with the result that any light incident on whichever position of the microlens 20 is shielded by the wiring lines 38a, 38b, and 38c before reaching the light receiving element of the adjacent picture element.

It should be noted that the wiring layer 38 may similarly be configured to have the aforementioned height and the wiring lines 38a, 38b, and 38c may similarly be disposed at the aforementioned intervals even in the case of disposing the wiring layer 38 between the light receiving elements 22R, 22L in the light receiving element pair 22. This configuration can prevent deterioration in the resolution and degradation in the stereoscopic effect of the resulting three-dimensional captured image.

Example 3 as to Lamination of Wiring Layer 38

Figure 10:
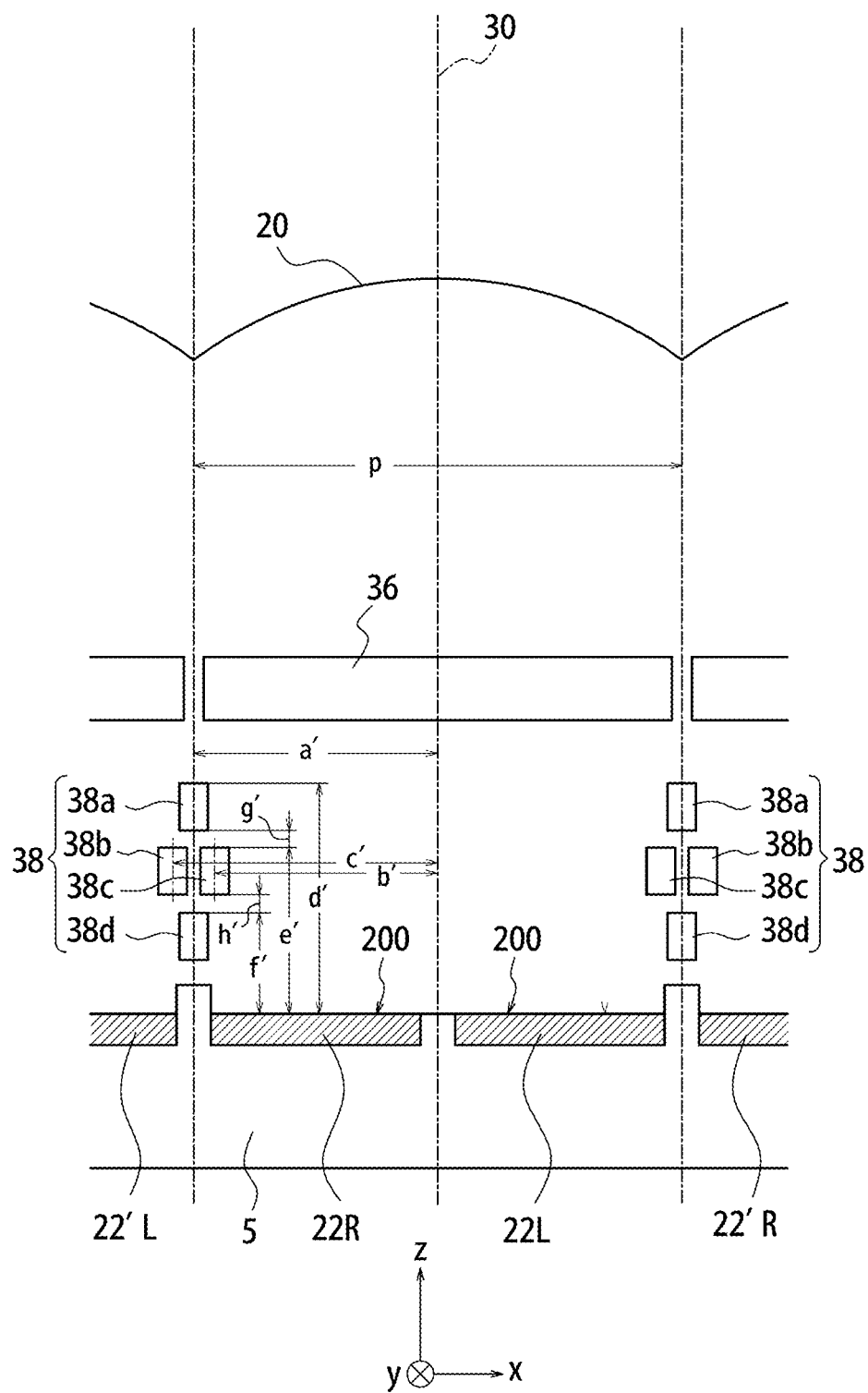
FIG. 10 is a diagram for illustrating Example as to how the wiring layers are laminated.

FIG. 10 illustrates Example 3 as to how to laminate the wiring lines of the wiring layer 38. In Example 3, the wiring layer 38 includes the wiring lines 38a, 38b, 38c, and 38d, which are disposed at intervals shown in a sectional view of the image sensor 10. For example, the wiring line 38d is disposed in the bottom layer, the wiring lines 38b and 38c are disposed in parallel to each other thereon, and the wiring line 38a is further laminated thereon, where the wiring lines 38a, 38b, 38c and 38d each have, in section thereof, a dimension of 1 μm in the X-axis direction while having a dimension of 1.3 μm in the Z-axis direction. It should be noted that the curvature radius r and the pitch p of the microlens 20, the average refractive index nav2 of the medium disposed in the space from the microlens 20 to the upper surface of the wiring layer 38, the average refractive index nav of the medium disposed in the space from the microlens 20 to the light receiving surface 200 of the light receiving elements 22L, 22R, and the height hb of the wiring layer 38 are similar to those of Examples 1 and 2.

In this case, the wiring lines 38a, 38b, 38c, and 38d may be disposed so as to satisfy the following conditions:

the distance from the optical axis 30 to the center of the wiring line 38a: a'=5 μm the distance from the optical axis 30 to the center of the wiring line 38c of the wiring lines 38b and 38c that is closer to the optical axis 30: b'=4 μm;

the distance from the optical axis 30 to the center of the wiring line 38b of the wiring lines 38b and 38c that is farther from the optical axis 30: c'=6 μm;

the distance from the light receiving surface 200 to the upper surface of the wiring line 38a: d'=6 μm;

the distance from the light receiving surface 200 to the upper surface of the wiring line 38b (38c): e'=4 μm;

the distance from the light receiving surface 200 to the upper surface of the wiring line 38d: f'=2 μm;

the distance from the lower surface of the wiring line 38a to the upper surface of the wiring line 38b (38c): g'=0.7 μm; and the distance from the lower surface of the wiring line 38b (38c) to the upper surface of the wiring line 38d: h'=0.7 μm, with the result that any light incident on whichever position of the microlens 20 is shielded by the wiring lines 38a, 38b, 38c, and 38d before reaching the light receiving element of the adjacent picture element.

It should be noted that the wiring layer 38 may similarly be configured to have the aforementioned height and the wiring lines 38a, 38b, 38c, and 38d may similarly be disposed at the aforementioned intervals even in the case of disposing the wiring layer 38 between the light receiving elements 22R, 22L in the light receiving element pair 22. This configuration can prevent deterioration in the resolution and degradation in the stereoscopic effect of the resulting three-dimensional captured image.

Though the disclosure has been illustrated with reference to the drawings and Examples, it should be noted that various alterations and modifications may be available to those skilled in the art, based on this disclosure. Thus, such alterations and modifications can be made without departing from the scope of the disclosure. For example, functions or the like included in each unit is relocatable to be consistent logically possible, and a plurality of units may be combined into one or a single unit may be divided. For example, the aforementioned description has been given by way of example of an image sensor having a spherical microlens for each picture element, but the image sensor may be configured to include a cylindrical lens instead.

As described above, this embodiment is capable of preventing deteriorations in the resolution and in the stereoscopic effect of the resulting three-dimensional captured image.

REFERENCE SIGNS LIST 10 image sensor
11 imaging lens
20 microlens
22 light receiving element pair
38 wiring layer
38a to 38d wiring lines

The invention claimed is:

1. An image sensor, comprising:
a pair of light receiving elements which is disposed for each of two-dimensionally aligned lenses and configured to receive light from a subject, wherein one of the light receiving elements are configured to output a pixel signal constituting one of captured images in a pair, and the other of the light receiving elements are configured to output a pixel signal constituting the other of the captured images in a pair, the captured images in a pair having a parallax for displaying a three-dimensional captured image of the subject; and
a wiring layer disposed between the light receiving elements, wherein the wiring layer includes a plurality of wiring lines laminated spaced apart from one another, the wiring lines for transmitting an input signal or an output signal to and from the light receiving elements, wherein
the lenses each have a curvature radius of r,
the lenses are disposed at intervals of p,
the lens and the distal surface of the wiring layer in the laminating direction has a medium disposed therebetween, the medium having an average refractive index of nav2,
the wiring layer has a distance hb measured from the light receiving surface of the light receiving element to the distal surface of the wiring layer in the laminating direction, and
the curvature radius r, the interval p, the average refractive index nav2, and the distance hb satisfying the relation of $1.4 \leq (1/p) \cdot [r/(nav2-1)-hb] \leq 3$.

2. The image sensor according to claim 1, wherein the wiring layer is disposed between the light receiving element pairs.

3. The image sensor according to claim 2,
wherein the wiring lines of the wiring layers are laminated in such a manner as to shield light that would otherwise go beyond the lens to be incident onto the light receiving element associated with another lens adjacent to the lens.

4. An imaging device, comprising:
the image sensor of claim 3; and
a display for displaying a three-dimensional image based on the captured images in a pair of claim 3.

5. An imaging device, comprising:
the image sensor of claim 2; and
a display for displaying a three-dimensional image based on the captured images in a pair of claim 2.

6. The image sensor according to claim 1, wherein at least one of the plurality of wiring layers is made of one of aluminum and copper.

7. The image sensor according to claim 6,
wherein the wiring lines of the wiring layers are laminated in such a manner as to shield light that would otherwise go beyond the lens to be incident onto the light receiving element associated with another lens adjacent to the lens.

8. An imaging device, comprising:
the image sensor of claim 7; and
a display for displaying a three-dimensional image based on the captured images in a pair of claim 7.

9. An imaging device, comprising:
the image sensor of claim 6; and
a display for displaying a three-dimensional image based on the captured images in a pair of claim 6.

10. The image sensor according to claim 1,
wherein the wiring lines of the wiring layers are laminated in such a manner as to shield light that would otherwise go beyond the lens to be incident onto the light receiving element associated with another lens adjacent to the lens.

11. An imaging device, comprising:
the image sensor of claim 10; and
a display for displaying a three-dimensional image based on the captured images in a pair of claim 10.

12. An imaging device, comprising:
the image sensor of claim 1; and
a display for displaying a three-dimensional image based on the captured images in a pair of claim 1.

* * * * *